United States Patent
Miyashita et al.

(10) Patent No.: US 7,085,974 B2
(45) Date of Patent: Aug. 1, 2006

(54) SEMICONDUCTOR DEVICE, METHOD OF TESTING THE SAME AND ELECTRONIC INSTRUMENT

(75) Inventors: Koji Miyashita, Matsumoto (JP); Masaya Uehara, Chino (JP)

(73) Assignee: Seiko Epson Corporation, Tokyo (JP)

( * ) Notice: Subject to any disclaimer, the term of this patent is extended or adjusted under 35 U.S.C. 154(b) by 587 days.

(21) Appl. No.: 10/314,433

(22) Filed: Dec. 6, 2002

(65) Prior Publication Data

US 2003/0126525 A1 Jul. 3, 2003

(30) Foreign Application Priority Data

Dec. 6, 2001 (JP) ............................. 2001-373159

(51) Int. Cl.
*G11C 29/00* (2006.01)
*G11C 7/00* (2006.01)

(52) U.S. Cl. ...................................... 714/718; 365/201
(58) Field of Classification Search ................ 714/718, 714/815, 814; 365/200, 201

See application file for complete search history.

(56) References Cited

U.S. PATENT DOCUMENTS

| 6,473,455 | B1 * | 10/2002 | Kwon .......................... 375/228 |
| 6,594,186 | B1 * | 7/2003 | Kodaira et al. ............. 365/201 |
| 2003/0026149 | A1 * | 2/2003 | Braceras et al. ............ 365/203 |

FOREIGN PATENT DOCUMENTS

| JP | 04-061420 | 2/1992 |
| JP | 10-172298 | 6/1998 |
| JP | 11-185497 | 7/1999 |
| JP | 2001-236797 | 8/2001 |

OTHER PUBLICATIONS

U.S. Appl. No. 10/171,421, filed Jun. 12, 2002, Kodaira, et al.

* cited by examiner

*Primary Examiner*—Phung My Chung
(74) *Attorney, Agent, or Firm*—Hogan & Hartson LLP

(57) ABSTRACT

A semiconductor device having a plurality of memory cells for storing data, an address input circuit having an address signal generation section for independently generating an address signal using a clock signal in a test mode, and a delay circuit for delaying an input time of the address signal from the address input circuit to a subsequent circuit for a predetermined time period which is equal to or longer than the time necessary for the generation of the address signal.

11 Claims, 14 Drawing Sheets

SEMICONDUCTOR DEVICE, METHOD OF TESTING THE SAME AND ELECTRONIC INSTRUMENT

Japanese patent Application No. 2001-373159, filed on Dec. 6, 2001, is herein incorporated by reference in its entirety.

BACKGROUND OF THE INVENTION

The present invention relates to a semiconductor device having memory cells, a method of testing the semiconductor device, and an electronic instrument.

In semiconductor device fabrication, it is general to conduct various tests at the wafer level whenever possible in order to avoid wasting processes such as packaging as much as possible.

For the inspection of semiconductor devices at the wafer level, tests are conducted in which the semiconductor devices are connected to a tester (semiconductor device test system) through a probe card equipped with a plurality of probes. As shown in FIG. 14 by a pattern diagram, for example, in this inspection, separate probes 3010 of a probe card 3000 are brought into contact with terminals such as data input/output terminals, which are formed on each of chips of a semiconductor wafer 2000, and the input and output of address signals, data signals, control signals and power sources are conducted between the tester and the semiconductor devices. Such the tester has a lot of input/output circuits for inputting and outputting data with the semiconductor devices and drivers for sending address signals and control signals, but the numbers of such input/output circuits and drivers are limited of themselves.

The number of semiconductor devices mounted on a single wafer, that is, the number of chips and the number of terminals disposed in the separate chips have been increasing more and more with the realization of large scale integration. Accordingly, to inspect many semiconductor devices formed on a single wafer, tests need to be divided and conducted for many times, requiring long hours for inspection.

In addition, it is known that in order to inspect semiconductor devices at the wafer level, contacting the probes 3010 to separate terminals of the semiconductor devices, such as address input terminals, causes damage in the terminals and problems occur in bonding of the terminals due to such the damage in the terminals, leading to the semiconductor device as a completed product to be defective. Therefore, the number of times to contact the probes to the terminals is preferably as small as possible.

Furthermore, in the semiconductor devices, burn-in is often conducted to cause as many initial failures as possible before shipping and to take defective products away from the products to be shipped. Moreover, burn-in is the test that electronic devices are operated at temperatures and voltages higher than normal operating conditions and strong stress is applied to the electronic devices, whereby initial failures are generated for a short time to eliminate defective devices before shipping. Traditionally, burn-in in the semiconductor devices has often been conducted for completed products after packaging with ceramics and resins. However, the manner wastes the assembly cost of chips found defective in burn-in. Considering this, the wafer burn-in which is done at the wafer level becomes to be conducted.

In the wafer burn-in, a semiconductor wafer is placed in a burn-in system for exclusive use in order to operate chips at higher temperature conditions. In the meantime, such the burn-in system has been provided with tester functions recently. However, the number of semiconductor devices to be tested simultaneously by such a tester equipped in the burn-in system is often fewer than that of a typical tester. Accordingly, testing all the semiconductor devices on a wafer takes much longer time than the typical tester does.

BRIEF SUMMARY OF THE INVENTION

The present invention is devised in the light of the above problems and may provide a semiconductor device, a method of testing such semiconductor device, and an electronic instrument, having either of the following effects:

(1) reducing the time necessary for testing; and (2) reducing damages on terminals in testing at the wafer level.

According to one aspect of the present invention, there is provided a semiconductor device comprising:

a plurality of memory cells for storing data;

a clock signal input terminal to which a clock signal is inputted;

a test mode signal input terminal to which a test mode signal for instructing operation in a test mode is inputted;

an address generation section which generates an address signal for selecting part of the memory cells; and a delay circuit which delays an input time of the address signal from the address generation section to a subsequent circuit for a predetermined time period, based on the clock signal, wherein the address generation section has an address signal generation section which generates each bit of the address signal having a plurality of bits, using the clock signal in the test mode; and a plurality of address holding circuits which temporarily holds respective bit of the address signal.

According to this aspect of the invention, the address signal generation section uses the clock signal to generate the address signal having two or more bits in the test mode, so that addressing can be done without inputting a signal to an address input terminal to which addresses are externally inputted. Therefore, in the test mode, addressing can be done without contacting the probes of the tester to the address input terminal. Damages on the address input terminal in testing at the wafer level thus can be reduced.

In addition, the number of probes used by the tester for a single semiconductor device can be decreased. Thus, the number of semiconductor devices to be tested simultaneously by the tester having the limited number of probes can be increased. Consequently, the time required for testing a single semiconductor device at the wafer level can be shortened.

Furthermore, because of the provision of the delay circuit for delaying an input time of the address signal from the address generation section to the subsequent circuit after the rise or fall of the clock signal used for generating the address signal, for example, the addresses surely updated at every clock signal can be outputted to the subsequent circuit by properly selecting the time of delay.

Since the address signal is generated based on the clock signal, at least one bit among the bits of the address signal may change in every half clock cycle of the clock signal. Accordingly, the address signal allows selecting the plurality of the memory cells sequentially.

The predetermined time period may be equal to or longer than the time necessary for the generation of the address signal by the address signal generation section.

Since the delay circuit delays the output time of the address signal to the circuit subsequent to the address generation section for the time period equal to or longer than the time necessary for the generation of the address signal by the address signal generation section based on the clock signal, the addresses surely updated in every half clock cycle of the clock signal can be outputted to the subsequent circuit.

The address signal generation section may have a plurality of serially connected divider circuits for dividing and outputting an inputted signal. Each of the divider circuits may be a binary counter, for example. The clock signal may be inputted to a first divider circuit among the divider circuits; each of the divider circuits other than the first divider circuit may receive an output from a preceding one of the divider circuits; the clock signal may be inputted to one of the address holding circuits; and each of the address holding circuits other than the address holding circuit which receives the clock signal may receive an output from corresponding one of the divider circuits.

The semiconductor device may further comprise a decoder circuit for decoding the address signal outputted from the plurality of the address holding circuits. In this case, the delay circuit may delay an input time of the address signal to the decoder circuit for a predetermined time period, based on the clock signal. Alternatively, the delay circuit may delay the time of decoding the address signal by the decoder circuit for a predetermined time period, based on the clock signal.

The address generation section may further include a switching section for determining which of the address signal generated by the address signal generation section and an externally inputted address signal is held by the address holding circuits.

According to the present invention, the switching section can switch between the normal mode in which addresses are specified by an external address signal, and the test mode in which addresses are specified by the address signal generated based on the clock signal.

According to another aspect of the present invention, there is provided an electronic instrument comprising the above semiconductor device.

According to still another aspect of the present invention, there is provided a method of testing a semiconductor device comprising the steps of:

generating an address signal having a plurality of bits by using a clock signal; and outputting the address signal to a subsequent circuit at a time delayed for a predetermined time period, based on the clock signal.

According to the method of the present invention, the address signal can generated in the semiconductor device based on the clock signal, similar to the semiconductor devices of the present invention.

DETAILED DESCRIPTION OF THE EMBODIMENTS

Hereafter, embodiments of the present invention will be described in detail with reference to the drawings. Although the embodiments are described with a semiconductor memory of the present invention applied to an SRAM (static random access memory) chip, but the invention is not limited thereto and can be applied to other types of semiconductor memories.

The Configuration of the SRAM Chip

Figure 1:
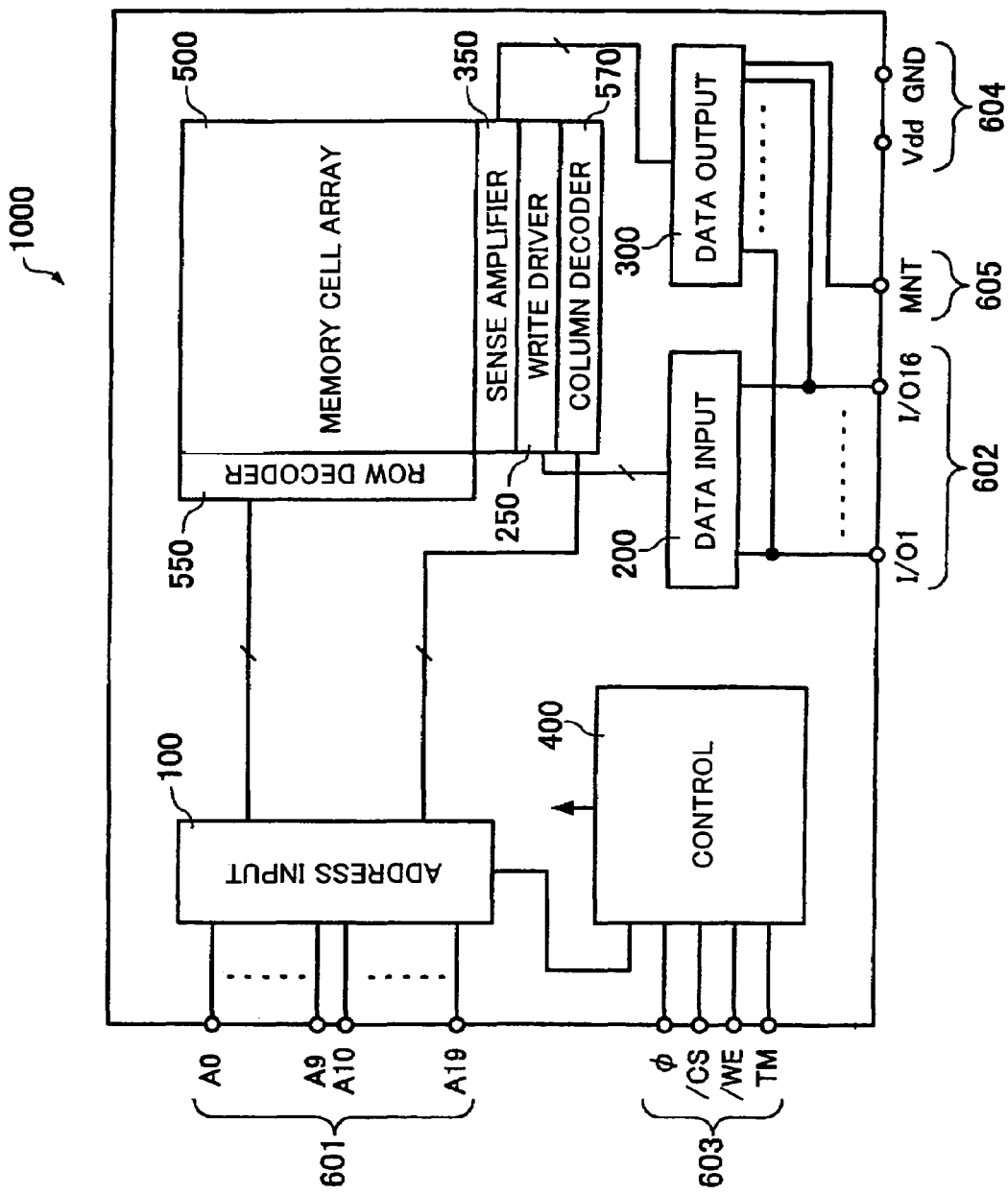
FIG. 1 is a block diagram schematically showing an SRAM chip.

FIG. 1 is a block diagram schematically showing an SRAM chip 1000 according to one embodiment of the present invention. As shown in the drawing, the SRAM chip 1000 includes an address input circuit 100 as an address generation section, a data input circuit 200, a data output circuit 300, a control circuit 400, a row decoder 550, a column decoder 570, a write driver 250, a memory cell array 500, a sense amplifier 350, and many terminals 601 to 605.

The memory cell array 500 is disposed with 16 megabits of memory cells, for example. In addition, the memory cell array 500 has extra redundant memory cells for replacing and repairing memory cells found defective in the chip state.

The terminals 601 to 605 are formed as metal pads, and almost all of them are connected to external terminals of a package through bumps and bonding wires in the packaging processes. When these terminals are roughly classified, they are address input terminals 601, to which address signals A0 to A19 are inputted, data input/output terminals 602 including terminals I/O 1 to I/O 16, to which data is inputted and outputted, control signal terminals 603, power source terminals 604 including a Vdd terminal and a GND terminal, and a monitor terminal 605.

The control signal terminals 603 include a φ terminal to which clock signals are inputted, a /CS terminal to which chip select signals are inputted, a /WE terminal to which write enable signals are inputted, and a TM terminal as a test mode signal input terminal to which test mode signals are inputted. Furthermore, the chip select signal /CS and the write enable signal /WE are active low, whereas the test mode signal TM is active high. Accordingly, when the TM terminal is at high level, the SRAM chip 1000 is turned to be the test mode, whereas when the TM terminal is opened or at low level, the SRAM chip 1000 is turned to be the normal operation mode. The control signals inputted to the separate terminals of the control signal terminals 603, that is, the φ terminal, the /CS terminal, the /WE terminal, and the TM terminal, are inputted to the control circuit 400. Then, the control circuit 400 generates various control signals for controlling data write and data read in the SRAM chip 1000.

The address input circuit 100 as an address generation section outputs (internal) address signals for selecting part of memory cells to the row decoder 550 and the column decoder 570, based on the inputted external address signals A0 to A19 or independently.

The row decoder 550 creates row select signals based on the address signals outputted from the address input circuit 100. In addition, the column decoder 570 creates column decoding signals based on the address signals outputted from the address input circuit 100.

To the data input circuit 200, external data signals are inputted through the data input/output terminals 602 in writing data. Then, the data input circuit 200 outputs data signals to the write driver 250.

To the data output circuit 300, the signals that the data signals of the memory cells are amplified by the sense amplifier 350 are inputted in reading data. Then, the data output circuit 300 outputs data to outside through the data input/output terminals 602.

Memory Cell Array

Figure 2:
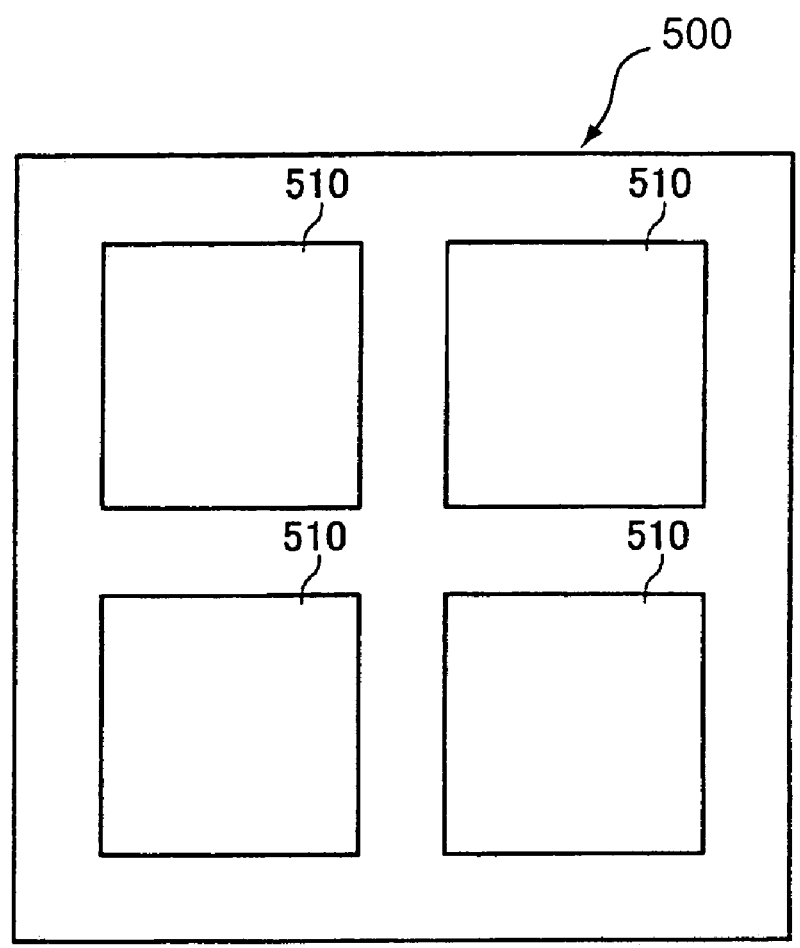
FIG. 2 is a diagram schematically showing a memory cell array provided with four memory cell mats.

As schematically shown in FIG. 2, the memory cell array 500 of the SRAM chip 1000 in the embodiment has four memory cell mats 510, that is, two memory cell mats 510 corresponding to the upper eight bits of data, and two memory cell mats 510 corresponding to the lower eight bits of data. The respective memory cell mats 510 are formed of a plurality of memory blocks.

Figure 3:
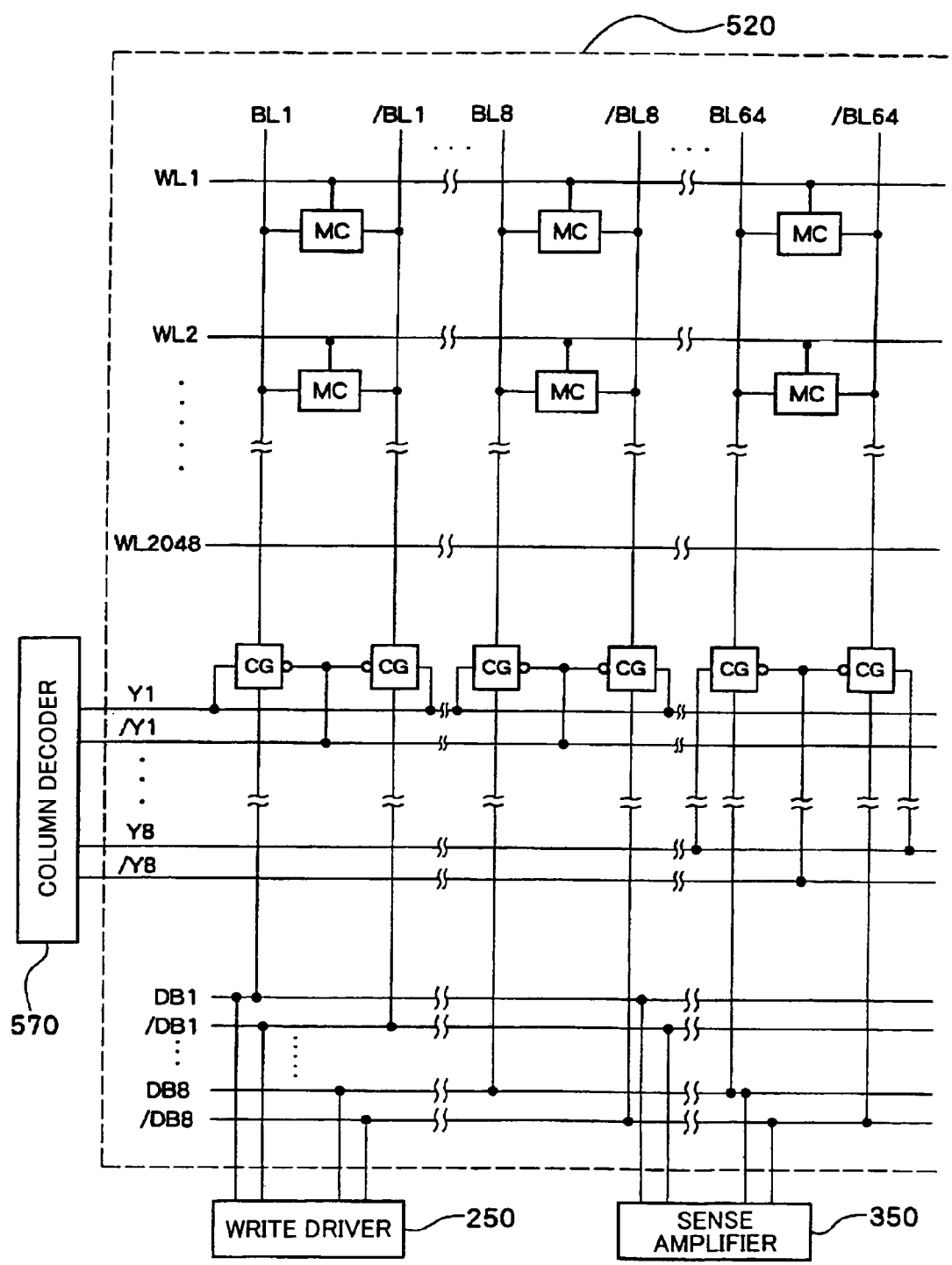
FIG. 3 is a diagram schematically showing a memory block and peripheral circuits.

FIG. 3 is a schematic diagram showing a memory block 52G within the memory cell mat 510 in which upper eight bits of data are stored and the peripheral circuits. This memory block 520 has 128 kilobits of memory cells MC. The memory cells MC are disposed in the memory block 520 in an array shape. Such the memory blocks 520 are disposed in the separate memory cell mats 510 in 32 blocks. A memory capacity of the memory cell array 500 with four memory cell mats 510 in total is 16 megabits.

Figure 4:
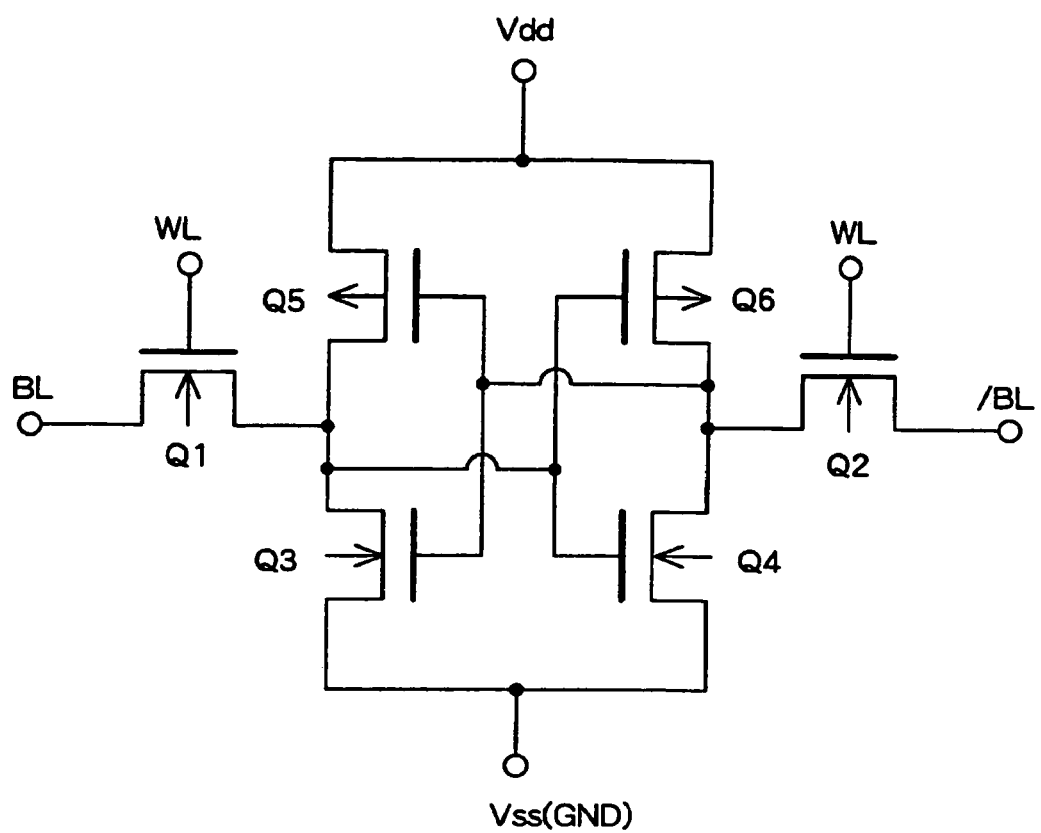
FIG. 4 is a circuit diagram illustrating the configuration of each memory cell MC.

The memory block 520 has a plurality of word lines WL1 to WL 2048, a plurality of pairs of bit lines (BL1,/BL1) to (BL64,/BL64) crossing these word lines, and the memory cells MC disposed corresponding to the intersection points of the word lines and the pairs of bit lines. As shown in FIG. 4, each of the separate memory cells MC is formed of six MOS transistors, transfer transistors Q1 and Q2, drive transistors Q3 and Q4, and load transistors Q5 and Q6.

In addition, to allow repair by replacing defective memory cells, each memory block has redundant word lines and redundant memory cells corresponding to these redundant word lines. Furthermore, some of the memory blocks 520 also have pairs of redundant bit lines and redundant memory cells corresponding to the pairs of redundant bit lines. As described above, since memory cells corresponding to the upper eight bits or lower eight bits of 16-bit data are disposed in each memory block, the redundant memory cell disposed corresponding to the redundant word line is an eight-bit memory cell.

Moreover, around the memory block 520, data buses (DB1,/DB1) to (DB8,/DB8) and decode signal lines (Y1,/Y1) to (Y8,/Y8) for transmitting output signals from the column decoder are disposed. The pairs of data buses (DB1,/DB1) to (DB8,/DB8) are connected to the pairs of bit lines at every eight pairs of bit lines. When a pair of data buses (DB1,/DB1) is exemplified, the pair of data buses (DB1,/DB1) is connected to the pairs of bit lines (BL1,/BL1), (BL9,/BL9), (BL17,/BL17) . . . (BL57,/BL57), through column gates CG which are transmission gates. Connection control of the pairs of bit lines to the pairs of data buses by the column gates CG is performed according to decode signals (Y1,/Y1) to (Y8,/Y8) outputted from the column decoder 570. Besides, the pairs of data buses (DB1,/DB1) to (DB8,/DB8) are connected to the write driver 250 and the sense amplifier 350.

Note that FIG. 3 shows one memory block 520 inside the memory cell mat 510 where the upper eight bits of data are stored, and thus the pairs of data buses connected to each pair of bit lines are any one of the pairs of (DB1,/DB1) to (DB8,/DB8). However, in the memory cell mat 510 where the lower eight bits of data are stored, the pairs of data buses connected to each pair of bit lines are any one of pairs of (DB9,/DB9) to (DB16,/DB16) in the memory block 520.

Address Input Circuit

Figure 5:
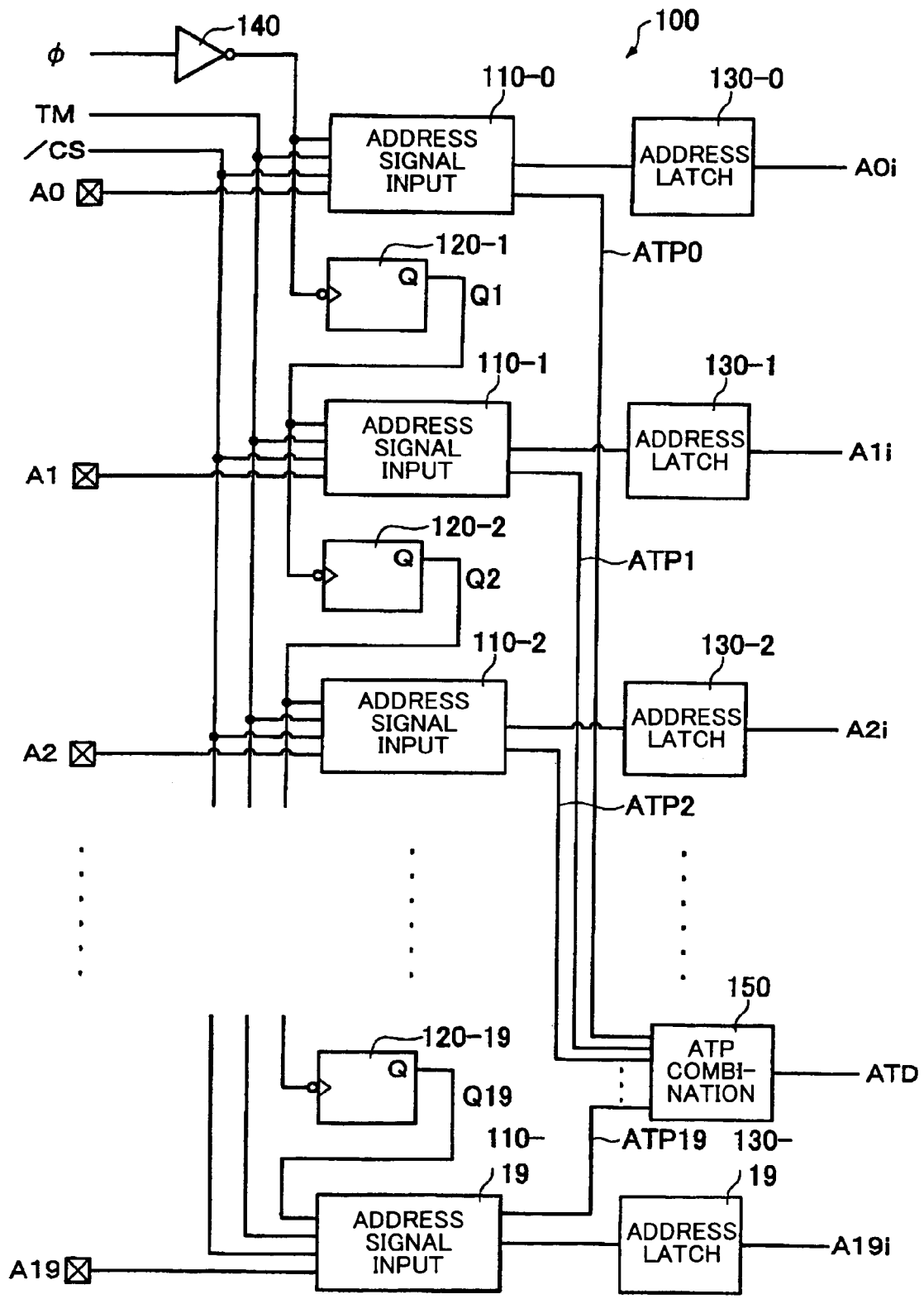
FIG. 5 is a block diagram showing an address input circuit, part of which is omitted.

As shown in FIG. 5, the address input circuit 100 includes twenty address signal input circuits 110-0 to 110-19, twenty address latches 130-0 to 130-19 as address holding circuits, nineteen T flip-flops 120-1 to 120-19 as branch circuits, and an ATP combination circuit 150 for combining address transition detection signals ATP 0 to ATP 19.

To the address signal input circuits 110-0 to 110-19, the /CS signal and the TM signal are inputted and any of the corresponding terminals A0 to A19 are connected.

In addition, the nineteen T flip-flops 120-1 to 120-19 forms nineteen stages of binary counters. In this counter, the clock signal φ is inputted to the address signal input circuit 110-0 and the clock input terminal of the T flip-flop 120-1 at the first stage through an inverter 140. Then, an output Q1 from the output terminal Q of the T flip-flop 120-1 at the first stage is inputted to the address signal input circuit 110-1 and the clock input terminal of the T flip-flop 120-2 at the second stage. Furthermore, the T flip-flops and the address signal input circuits are sequentially connected as similarly inputted and outputted, and so on. Finally, an output Q19 from the output terminal Q of the T flip-flop 120-19 at 19th stage is inputted to the address signal input circuit 110-19.

More specifically, when each of the separate T flip-flops 120-1 to 120-19 is considered to be a divider circuit, the T flip-flops can be regarded as a plurality of divider circuits serially connected for dividing and outputting inputted signals. Then, the clock signal φ is inputted to the T flip-flop 120-1 as the first divider circuit, and the output of the previous stages to the separate stages is inputted to the T flip-flops 120-2 to 120-19 as the other divider circuits. Moreover, in the test mode, the clock signal inversed by the inverter 140 is inputted to the address latch 130-0 as the address holding circuit through the address signal input circuit 110-0, and the outputs from the T flip-flops 120-1 to 120-19 as the corresponding divider circuits are inputted to the address latches 130-1 to 130-19 as the address holding circuits through the corresponding address signal input circuits 110-1 to 110-19.

The address latches 130-0 to 130-19 as the address holding circuits output the (internal) address signal to the (internal) address signal line in accordance with the control signal outputted from the control circuit 400.

Figure 6:
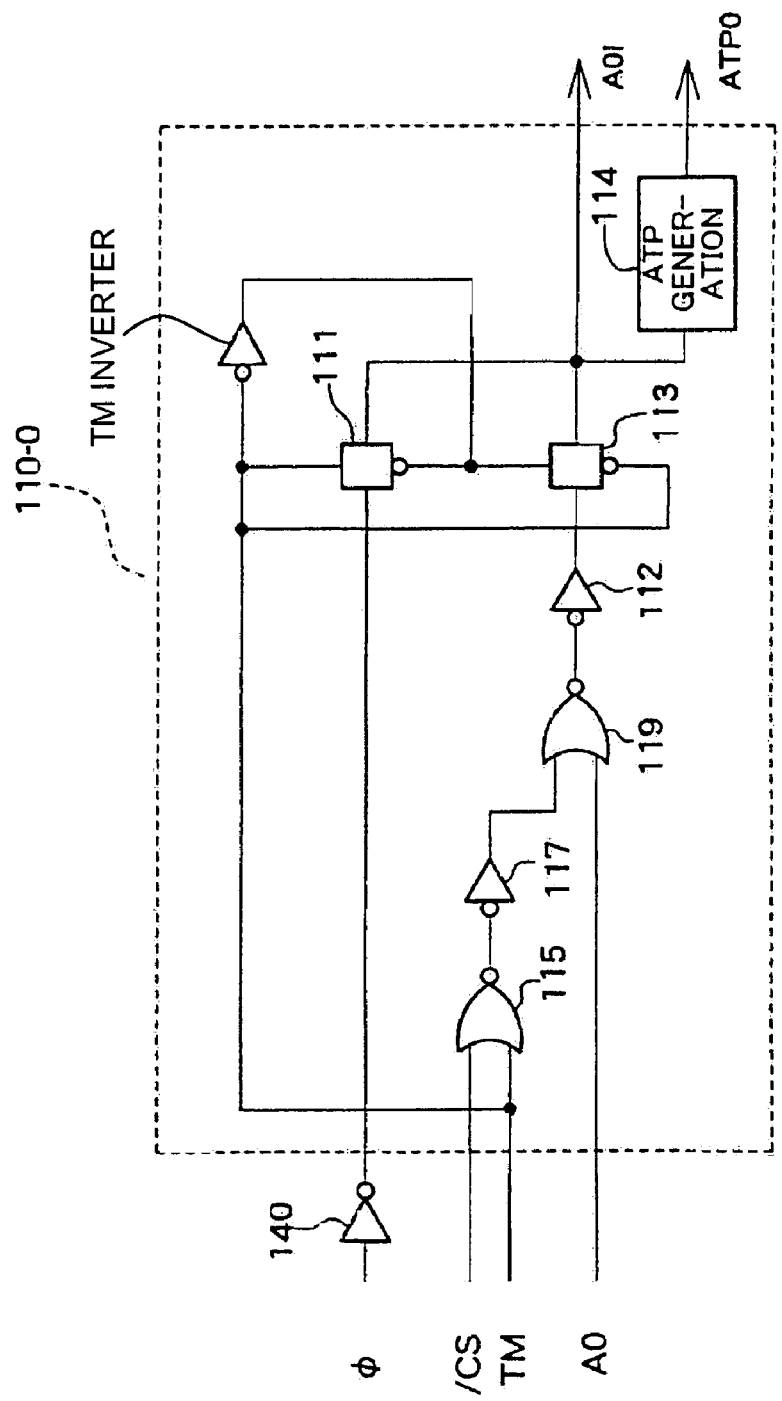
FIG. 6 is a block diagram illustrating one of address signal input circuits.

Next, the details of the address signal input circuit will be described as the address signal input circuit 110-0 is exemplified. FIG. 6 is a block diagram of the address signal input circuit 110-0.

In the normal operation, the /chip select signal (/CS) is at low level (active), whereas the test mode signal (TM) is at low level (non-active) Therefore, the high level signal outputted from a NOR gate 115 is inverted by an inverter 117 to be the low level signal and inputted to a NOR gate 119. In addition, the test mode signal at low level turns on a transmission gate 113. Accordingly, the external address signal inputted from the terminal A0 is inverted by the NOR gate 119, inverted by an inverter 112, passed through the transmission gate 113, and outputted to the row decoder 550 as the (internal) address signal A0$i$. The address signal A0$i$ is also inputted to an ATP generation circuit 114. The ATP generation circuit 114 generates the address transition detection signal ATP0 to be the pulse signal when the address signal A0$i$ is inverted. The address transition detection signal ATP0 is inputted to the ATP combination circuit 150 shown in FIG. 5. Furthermore, the test mode signal TM at low level turns off a transmission gate 111, and thus the input of the signal that the clock signal $\phi$ is inverted by the inverter 140 is inhibited.

During the test mode, the test mode signal is at high level (active), the transmission gate 111 is turned on, the clock signal $\phi$ inverted by the inverter 140 is passed through the transmission gate 111, and it is outputted to the row decoder 550 as the (internal) address signal A0$i$. The address signal A0$i$ is also inputted to the ATP generation circuit 114. The ATP generation circuit 114 generates the address transition detection signal ATP0 when the address signal A0$i$ is inverted. The address transition detection signal ATP0 is inputted to the ATP combination circuit 150 shown in FIG. 5. Moreover, the test mode signal TM at high level turns off the transmission gate 113, and thus the input from the terminal A0 is inhibited.

Figure 7:
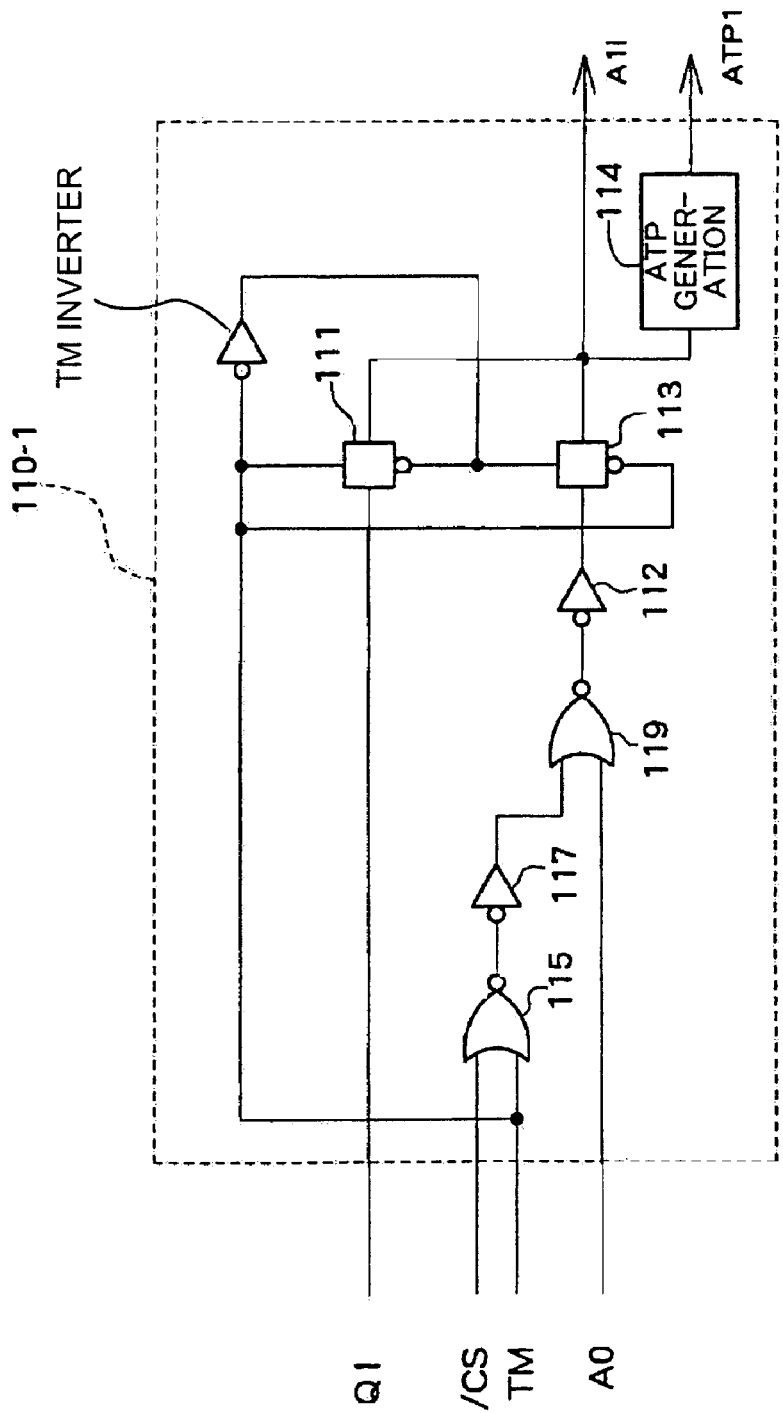
FIG. 7 is a block diagram illustrating another one of the address signal input circuits.

FIG. 7 is a circuit diagram of the address signal input circuit 110-1. As apparent from the drawing, the address signal input circuit 110-1 is formed as similar to the address signal input circuit 110-0. The different points are in that the signal inputted to the transmission gate 111 is the output signal Q1 of the T flip-flop 120-1, the address signal to be outputted is the address signal A1$i$, and the address transition detection signal generated by the ATP generation circuit 114 in inverting the address signal A1$i$ is the ATP1.

Similarly in the address signal input circuits 110-2 to 110-19, the signal inputted to the transmission gate 111 is the output signals Q2 to Q19 of the corresponding T flip-flops 120-2 to 120-19, and the address signal to be outputted is the corresponding address signals A2$i$ to A19$i$. Then, the address transition detection signals generated by the separate ATP generation circuits 114 in inverting the corresponding address signals A2$i$ to A19$i$ are the corresponding ATP2 to ATP19.

In this manner, in the address signal input circuit 110-0, the signal inputted to the transmission gate 111 is the clock signal $\phi$ inverted by the inverter 140. In the address signal input circuits 110-1 to 110-19, the signal inputted to the transmission gate 111 is the output signals Q1 to Q19 of the corresponding T flip-flops 120-1 to 120-19. Then, during the test mode, the test mode signal TM is at high level. Thus, the signals are passed through the transmission gate 111, and they are outputted as the address signals A0$i$ to A19$i$ to be held in the separate address latches 130-0 to 130-19. In addition, the test mode signal at high level turns off the transmission gate 113, and thus the input from the input/output terminals A0 to A19 is inhibited. The nineteen T flip-flops 120-1 to 120-19, as shown in FIG. 5 form a counter. During the test mode, a clock signal is inputted to the first stage of the nineteen T flip-flops. The counter functions as the address signal generation section for generating the address signal in the test mode.

Furthermore, in the normal mode, that is, when the TM signal is at low level and the /CS signal is at low level (active), the address signals inputted to the address input terminals 601 (A0 to A19) are transmitted to each of the transmission gates 113, they are passed through the transmission gates 113, and they are outputted as the address signals A0$i$ to A19$i$ to be held in each of the address latches 130-0 to 130-19. The address signals A0$i$ to A019$i$ are the signals of 20 bits formed of the bits of the inversion signal of the clock signal $\phi$ and the outputs Q1 to Q19 of the divider circuits 120-1 to 120-19. Therefore, the address signal is changed by at least one bit in every half clock cycle of the clock signal $\phi$. Moreover, the test mode signal at low level turns off the transmission gate 111, and thus the input of the address signal generated by the address signal generation section is inhibited.

In this manner, the circuit including the transmission gate 111 and the transmission gate 113 of each of the address signal input circuits 110-0 to 110-19 operates as a switching section for switching the address latches 130-0 to 130-19 to hold either the address signal generated by the address signal generation section or the external address signal inputted from the address input terminals 601 (A0 to A19). Besides, this switching section may be formed of other switching elements such as clocked inverters instead of the transmission gates.

As described above, according to the address input circuit 100 of the embodiment, in the test mode, the address signal generation section uses the clock signal $\phi$ to generate the address signal. Thus, addressing can be done without inputting signals to the address input terminals 601 for inputting addresses from outside. Accordingly, in the test mode, addressing can be done without contacting the probes of the tester to the address input terminals 601. On this account, the damage of the address input terminals 601 can be reduced due to the inspection at the wafer level.

In addition, the number of probes used for a single SRAM chip 1000 by the tester can be decreased, and thus the number of SRAM chips 1000 to be tested simultaneously by the tester having the limited number of probes can be increased. Consequently, the time required to test a single SRAM chip 1000 at the wafer level can be shortened.

Delay Circuit

In the address input circuit, the output of the T flip-flops 120-1 to 19 at the separate stages as the serially connected divider circuits was used as one bit for the internal address signal in the test mode. In this manner, when a plurality of T flip-flops is serially connected, a considerable time is needed until the state of the T flip-flops at the separate stages is inversed and the state of the last T flip-flop 120-19 is inversed after the clock signal $\phi$ has been inputted to the first T flip-flop 120-1. More specifically, a considerable time is taken until the internal address is determined after the clock signal $\phi$ has been inputted to the first T flip-flop 120-1.

Figure 8:
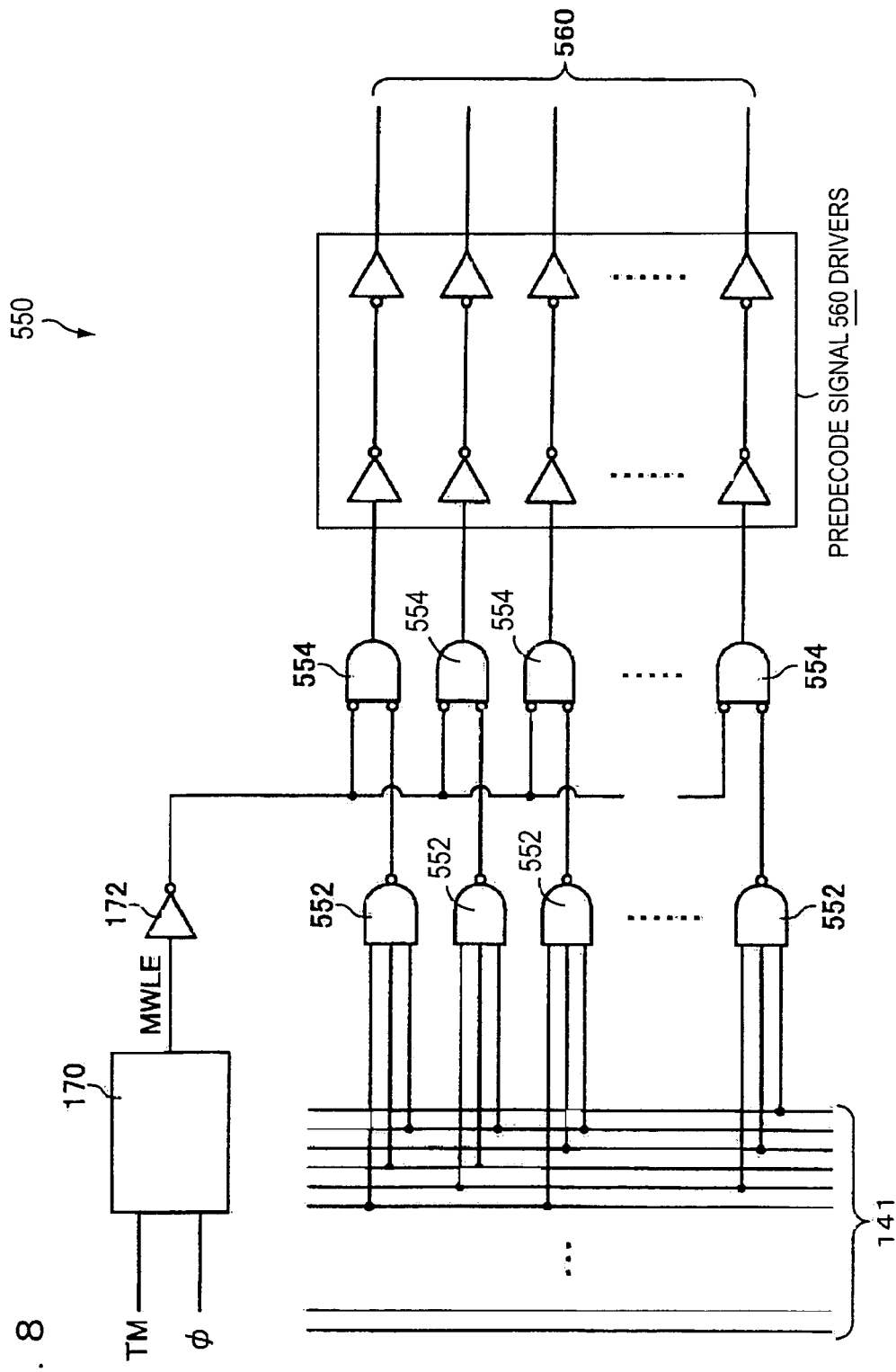
FIG. 8 is a block diagram showing part of a timer circuit and a row decoder circuit.

Then, in the test mode, used is the configuration with a delay circuit such as a timer circuit, which delays an input time of the address signal from the address generation section 100 to the subsequent circuit for a predetermined time period from the rise or fall of the clock signal $\phi$. FIG. 8 shows one example of such configuration or part of the timer circuit 170 and row decoder circuit 550. As shown in the drawing, in this portion of the decoder circuit 550 for generating a predecode signal 560 from the address signal transmitted from the internal address signal lines 141, the output of a NAND gate 552 that the input terminal is connected to the internal address signal line 141 is inputted to one input terminal of another NAND gate 554. To the other input terminal of the NAND gate 554, the output signal MWLE of the timer circuit 170 is inputted through an inverter 172. Therefore, the output of the NAND gate 554 is turned to be at high level and the signal of the corresponding predecode signal line is turned to be active only when the output of the NAND gate 552 is at low level and the output signal MWLE of the timer circuit 170 is at high level. Accordingly, the memory cell MC at the corresponding column can be selected.

Figure 9:
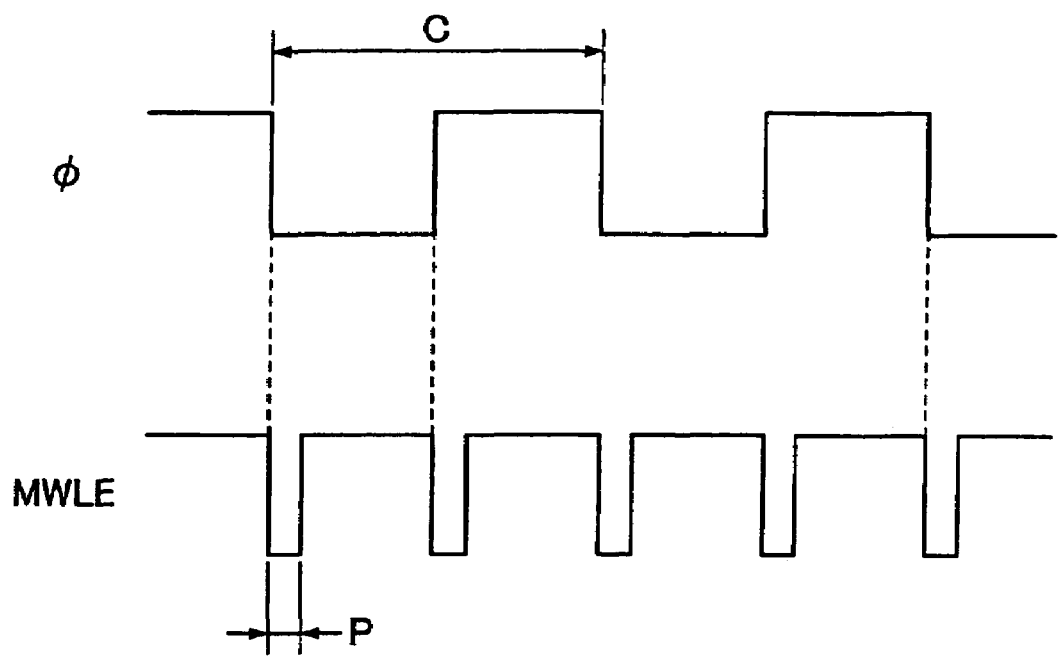
FIG. 9 is a diagram showing the relationship between a clock signal and an output signal of the timer circuit.

As shown in FIG. 8, the test mode signal TM and the clock signal φ are inputted to the timer circuit 170 to generate the output signal MWLE. More specifically, the output signal MWLE of the timer circuit 170 is usually at high level. However, when the test mode signal TM is at high level, that is, it shows the test mode, it becomes the pulse signal that is at low level for a predetermined time period P in synchronization with the rise or fall of the clock signal φ as shown in FIG. 9. The predetermined time period P is much shorter than the crock cycle C (50 nanoseconds, for example) and is equal to or longer than the time necessary for the generation of the address signal by the address signal generation section in the address generation section 100 (10 nanoseconds, for example). The time required to generate the address signal by the address signal generation section can be predicted by simulations, for example. As describe above, when the output signal MWLE of the timer circuit 170 is at low level, the signal of the predecode signal line is at low level and non-active, thus not selecting the memory cell MC at the corresponding column. Therefore, the selection of the memory cell MC is delayed for a predetermined time period during which the output signal MWLE of the timer circuit 170 is at low level after the rise or fall of the clock signal φ, and it is after the output signal MWLE of the timer circuit 170 is turned to be at high level.

Since an output time of the address signal to a circuit subsequent to the address generation section 100 is delayed for a time period equal to or longer than the time necessary for the generation of the address signal by the address signal generation section in the address generation section 100 after the rise or fall of the clock signal, depending on the configuration of the timer circuit 170, the addresses surely updated at every clock signal can be transmitted to the subsequent circuit.

Data Input Circuit

Figure 10:
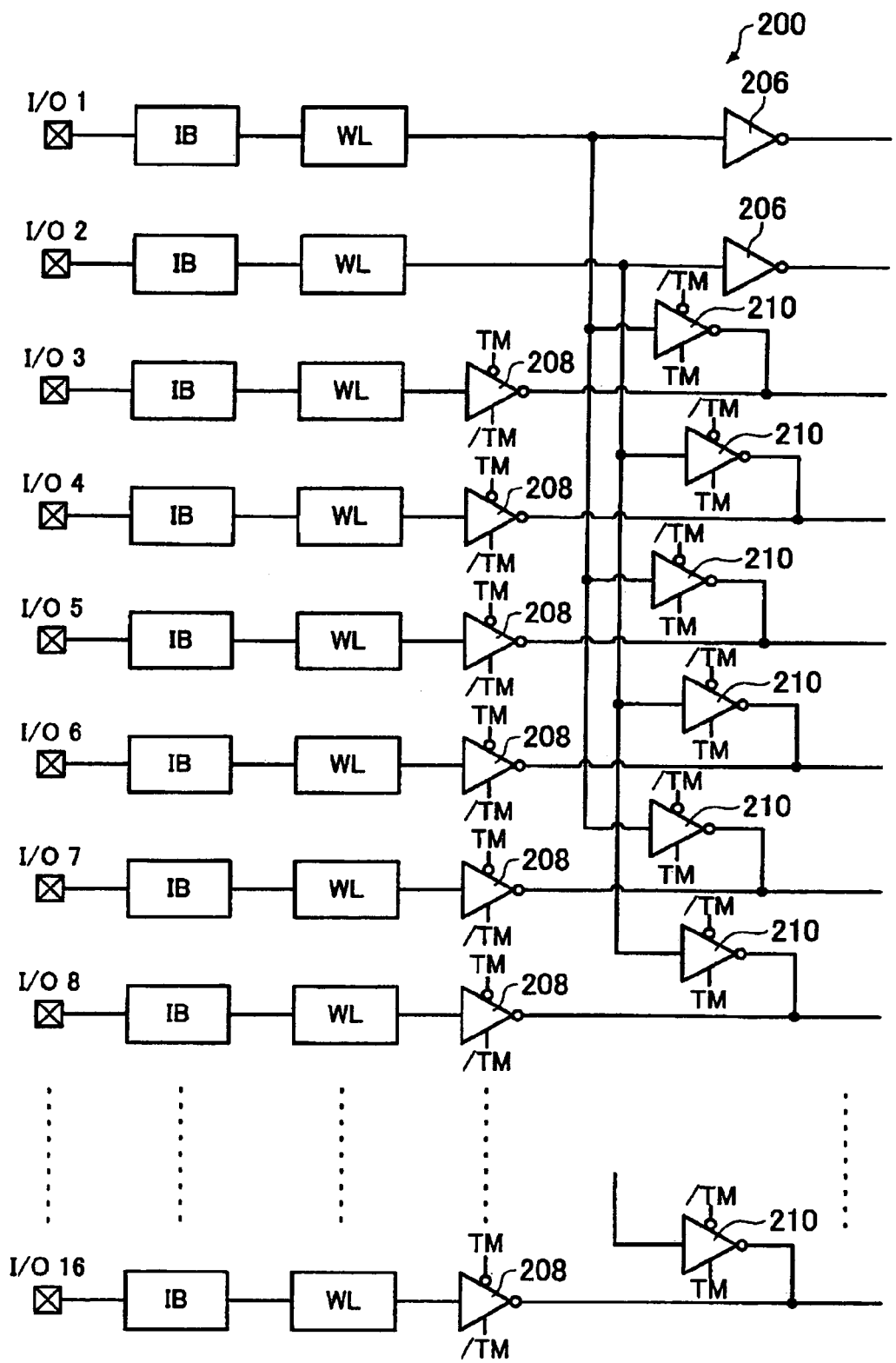
FIG. 10 is a block diagram showing an example of the configuration of a data input circuit.

FIG. 10 is a block diagram illustrating one example of the configuration of the data input circuit 200. As shown in the drawing, the data input circuit 200 has input buffers IB and write latches WL as input data holding sections corresponding to separate input/output terminals I/O 1 to I/O 16. More specifically, each input/output terminal is connected to the input buffer IB, and the input buffer IB is connected to the write latch WL.

Furthermore, the data input circuit 200 has a switching circuit for switching the following different states depending on whether to be in the normal mode or the test mode. In addition, whether to be in the test mode or the normal mode can be recognized whether the test mode signal TM inputted to the test mode signal input terminal (TM terminal) shows the test mode or not. By the operation of the switching circuit, the data input circuit 200 transmits the signals inputted to the separate input/output terminals I/O 1 to I/O 16 as the bits of data to the subsequent circuit such as the write driver 250 through the separate input buffers IB and the write latches WL in the normal mode. While in the test mode, according to the operation of the switching circuit, instead of using a plurality of signals inputted from a plurality of input/output terminals, the data input circuit 200 replaces the signals at a predetermined point in the circuit subsequent to each of the plurality of the input/output terminals by a signal at the point among one of the plurality of the input/output terminals, and it transmits to the subsequent circuit such as the write driver 250. Accordingly, in the test mode, the data input circuit 200 outputs the signal inputted to any one of the input/output terminals among the plurality of the input/output terminals to the subsequent circuit as the bits of data corresponding to the plurality of the input/output terminals.

As one example of such the switching circuit, a circuit including a plurality of clocked inverters 208 and a plurality of clocked inverters 210 is used in the embodiment, as shown in FIG. 10. According to this switching circuit, the signals corresponding to the output terminals I/O 1, I/O 3, I/O 5 and I/O 7 are all replaced by the signals that the output signals from the write latch WL in the signal path of the input/output terminal I/O 1 are inverted in the signal path following the write latches WL in the test mode. The I/O 3 is exemplified for description. In the test mode, the test mode signal TM is at high level (active). Thus, the clocked inverter 208 subsequent to the terminal I/O 3 is turned off, and the signal inputted from the terminal I/O 3 and passed through the input buffer IB and the WL 204 is cut off from the subsequent circuit. At the same time, to the signal line extended from the output terminal of the clocked inverter 208, the signal is connected that the clocked inverter 210 is turned on to invert the output signal of the write latch WL in the signal path from the terminal I/O 1. In the test mode, the similar signal replacement is performed in the I/O 5 and I/O 7. In addition, the output of each of the write latches WL subsequent to the input/output terminal I/O 1 is inverted by an inverter 206 subsequent to each of the write latches WL. Consequently, in the test mode, the signals corresponding to the input/output terminals I/O 1, I/O 3, I/O 5 and I/O 7 are all the signals that the output signals from the write latches WL in the signal path of the input/output terminal I/O 1 are inverted in the signal path following the write latches WL.

Similarly, in the test mode, the signals corresponding to the input/output terminals I/O 2, I/O 4, I/O 6 and I/O 8 are all the signals that the output signals from the write latch corresponding to the input/output terminal I/O 2 are inverted in the signal path following the write latches WL.

In this manner, in the test mode, the signals corresponding to the add-numbered input/output terminals among the input/output terminals I/O 1 to I/O 8 are all the inverted signals of the output signals from the write latch WL corresponding to the input/output terminal I/O 1 in the signal path following the write latches WL, and they are transmitted to the subsequent circuit such as the write driver 250. In addition, in the test mode, the signals corresponding to the even-numbered input/output terminals among the input/output terminals I/O 1 to I/O 8 are all the inverted signals of the output signals from the write latch corresponding to the input/output terminal I/O 2 in the signal path following the write latches WL, and they are transmitted to the subsequent circuit such as the write driver 250.

Furthermore, also in the circuit subsequent to the I/O 9 to I/O 16, as similar to the case of the circuit subsequent to the I/O 1 to I/O 8, the signals corresponding to the add-numbered input/output terminals among the input/output terminals I/O 9 to I/O 16 are all the inverted signals of the output signals from the write latch corresponding to the input/output terminal I/O 9 in the signal path following the write latches WL, and they are transmitted to the subsequent circuit such as the write driver 250 in the test mode. The signals corresponding to the even-numbered input/output terminals among the I/O 9 to I/O 16 are all the inverted signals of the output signals from the write latch corresponding to the input/output terminal I/O 10 in the signal path following the write latches WL, and they are transmitted to the subsequent circuit such as the write driver 250 in the test mode.

In the normal mode in which the TM signal is at low level, the clocked inverters 208 subsequent to the separate write latches of the I/O 3 to I/O 8 and I/O 11 to I/O 16 are turned on and the separate clocked inverters 210 are turned off. Thus, the output of the separate write latches WL subsequent to the separate input/output terminals is transmitted to the subsequent circuit such as the write driver 250 through the clocked inverter 208. Besides, the output of the separate write latches WL subsequent to the input/output terminals I/O 1, I/O 2, I/O 9 and I/O 10 is transmitted to the subsequent circuit such as the write driver 250 through the inverter 206 following the separate write latches WL.

In this manner, according to the data input circuit 200 of the embodiment, the switching circuit can switch so that the signal inputted to any one of input/output terminals among a plurality of input/output terminals is outputted to the subsequent sections as the same signal as that inputted to each of the plurality of the input/output terminals in inputting data to be stored in the memory cells MC during the test mode. Therefore, the data input circuit 200 can be operated as similar to the case that the same data is inputted to a plurality of terminals only by contacting the probe (contact) of a tester to a single terminal. Accordingly, the number of probes required to input data to a single SRAM chip 1000 can be reduced, and the number of the SRAM chips 1000 to be tested by the tester simultaneously can be increased. Consequently, the time required for testing a single SRAM chip 1000 at the wafer level can be shortened.

In addition, a probe can be brought into contact with only one input/output terminal among a plurality of input/output terminals to input data. Thus, the number of times to contact the probe to the input/output terminals can be reduced, and the damage of the input/output terminals can be decreased due to the tests at the wafer level.

Data Output Circuit

Figure 11:
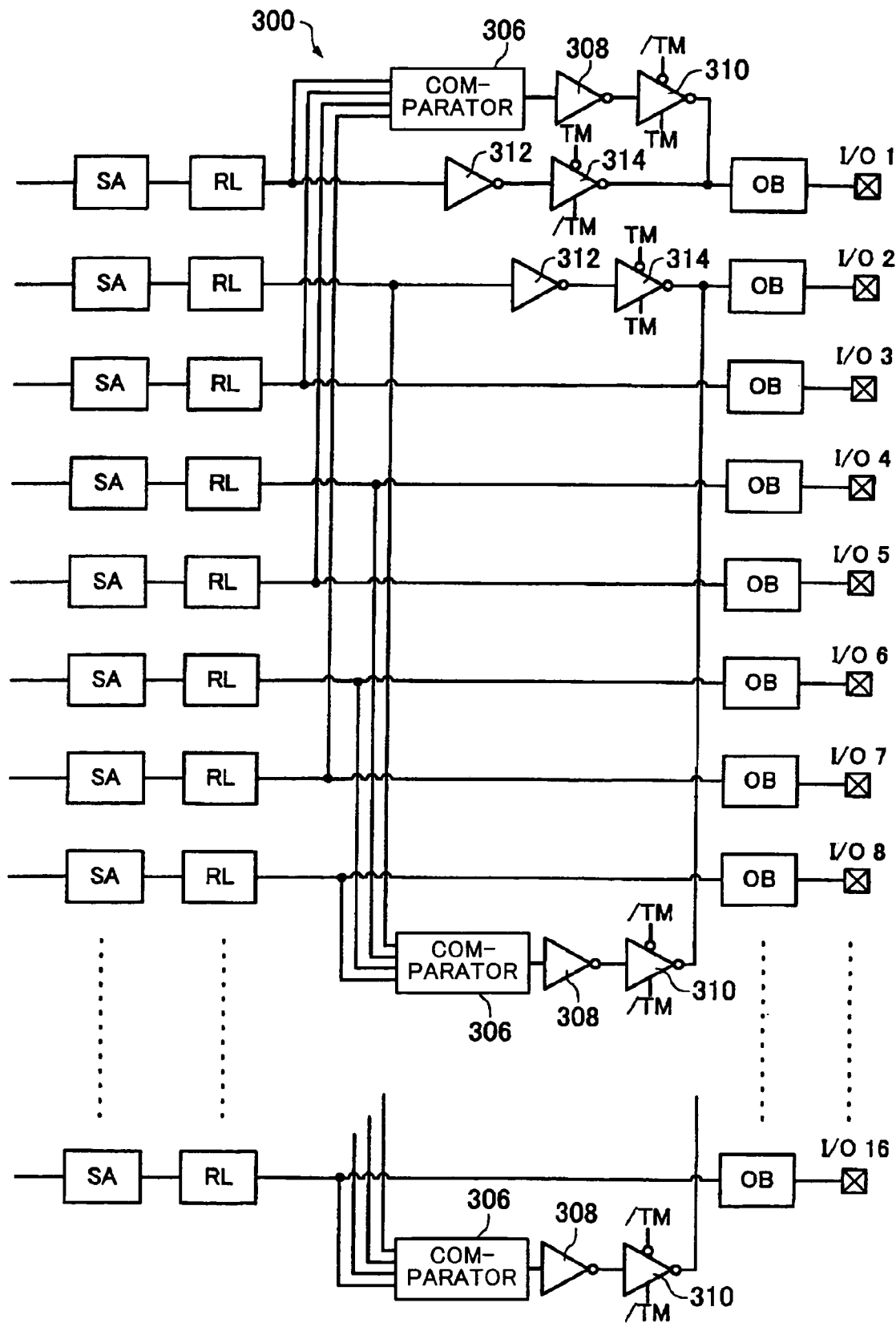
FIG. 11 is a block diagram showing an example of the configuration of a data output circuit.

FIG. 11 is a block diagram showing the configuration of the data output circuit 300 as a data output section. As shown in the drawing, the data output circuit 300 has a sense amplifier SA, a read latch RL as the output data holding section, and an output buffer OB for each of the plurality of the input/output terminals I/O 1 to I/O 16. More specifically, the signal sequentially passed through the sense amplifier SA, the read latch RL, and the output buffer OB, which are disposed for each, is transmitted to each of the input/output terminals 602.

Furthermore, the data output circuit 300 has a comparator 306 in which output data from the read latch corresponding to each of the input/output terminals in a group is inputted to determine whether the output data matches each other on the group of the input/output terminals by bit where the same signals are to be inputted to the write driver 250 in the data input circuit 200 during the test mode. This comparator 306 is disposed for every group of the input/output terminals.

Then, the data output circuit 300 has a switching section for switching the following different output states depending on whether to be in the normal mode or in the test mode. This switching section includes a plurality of clocked inverters 310 and a plurality of clocked inverters 314. More specifically, according to the operation of the switching section, the data output circuit 300 outputs the signals passed through the sense amplifier SA, the read latch RL as the output data holding section, and the output buffer OB to each of the input/output terminals I/O 1 to I/O 16 in the normal mode. In addition, according to the operation of the switching section, the data output circuit 300 transmits the output of the comparator 306 to one input/output terminal in the corresponding group in the test mode, that is, when the test mode signal TM to be inputted to the test mode signal input terminal (TM terminal) shows the test mode. Moreover, the output of the comparator 306 is fine to be connected to the monitor terminal 605.

As one example of such configuration, the outputs of the separate read latches RL corresponding to the input/output terminals I/o 1, I/O 3, I/O 5 and I/O 7 are inputted to the comparator 306 disposed corresponding to the group of the input/output terminals, as shown in FIG. 11. Besides, these input/output terminals are the input/output terminals by bit that are allowed to output the same signals to the write driver 250 in the data input/output circuit 200 during the test mode. Then, the output of the comparator 306 is transmitted to one input/output terminal in the group, to the I/O 1, for example, through the inverter 308, the clocked inverter 310, which is turned on in the test mode, that is, when the test mode signal TM is at high level, and the output buffer OB. In addition, the output of the read latch for the input/output terminal I/O 1 is inputted to an inverter 312, the output of the inverter is inputted to the clocked inverter 314, which is turned on in the normal mode and turned off in the test mode, and the output of the clocked inverter 314 is inputted to the output buffer OB of the input/output terminal I/O 1. Accordingly, the output from the input/output terminal I/O 1 becomes the data signal outputted by the read latch RL corresponding to the input/output terminal I/O 1 in the normal mode, whereas it becomes the data signal outputted by the comparator 306 corresponding to the group of the input/output terminals in the test mode.

Similarly, the outputs of the separate read latches RL corresponding to the input/output terminals I/O 2, I/O 4, I/O 6 and I/O 8 are inputted to the comparator 306 disposed for the group of the input/output terminals. These input/output terminals are also the input/output terminals by bit that are allowed to output the same signals to the write driver 250 in the data input circuit 200 during the test mode. Then, as similar to the above, according to the operations of the inverter 308, the clocked inverter 310, the inverter 312, and the clocked inverter 314 disposed for the group of the input/output terminals, the output from the input/output terminal I/O 2 becomes the data signal outputted by the read latch RL corresponding to the output terminal I/O 2 in the normal mode, whereas it becomes the data signal outputted by the comparator 306 corresponding to the group of the input/output terminals in the test mode.

Furthermore, the data output circuit 300 corresponding to the I/O 9 to I/O 16 is configured as similar to the circuit corresponding to the I/O 1 to I/O 8 in which the output signals from the read latches RL corresponding to the add-numbered input/output terminals among the output terminals I/O 9 to I/O 16 are inputted to the comparator 306 disposed for the group of the add-numbered input/output terminals, and the output of the comparator 306 is transmitted to one input/output terminal in the group, to I/O 9, for example, in the test mode. Similarly, the output signals from the read latches RL corresponding to the even-numbered input/output terminals among the input/output terminals I/O 9 to I/O 16 are inputted to the comparator 306 disposed for the group of the even-numbered input/output terminals and the output of the comparator 306 is transmitted to one input/output terminal in the group, to I/O 10, for example, in the test mode.

In the normal mode in which the TM signal is at low level, the outputs of all the comparators 306 are not transmitted to the input/output terminals because the clocked inverters 310 are turned off. To the input/output terminals I/O 1, I/O 2, I/O 9 and I/O 10 that the output signals of the comparators 306 are transmitted in the test mode, the output signals of the read latches RL corresponding to the separate input/output terminals are transmitted because the clocked inverters 314 are turned on.

As described above, according to the data output circuit 300 of the embodiment, whether to match the output data from the data input/output terminals where the same data has to be outputted can be detected by contacting the probes to the input/output terminals where the data is outputted from the comparators 306 without contacting the probes to all the data input/output terminals. Accordingly, the number of the SRAM chips 1000 to be tested by the tester at one time can be increased, and the time required for testing a single SRAM chip 1000 at the wafer level can be shortened. In addition, whether to match the output data from a plurality of data input/output terminals can be detected by contacting probes to only the input/output terminals to output data from the comparators 306. Therefore, the number of times to contact the probes to the input/output terminals in the tests can be decreased, and the damage of the input/output terminals can be reduced due to testing the SRAM chips 1000 at the wafer level.

Method of Testing a Semiconductor Device

Figure 12:
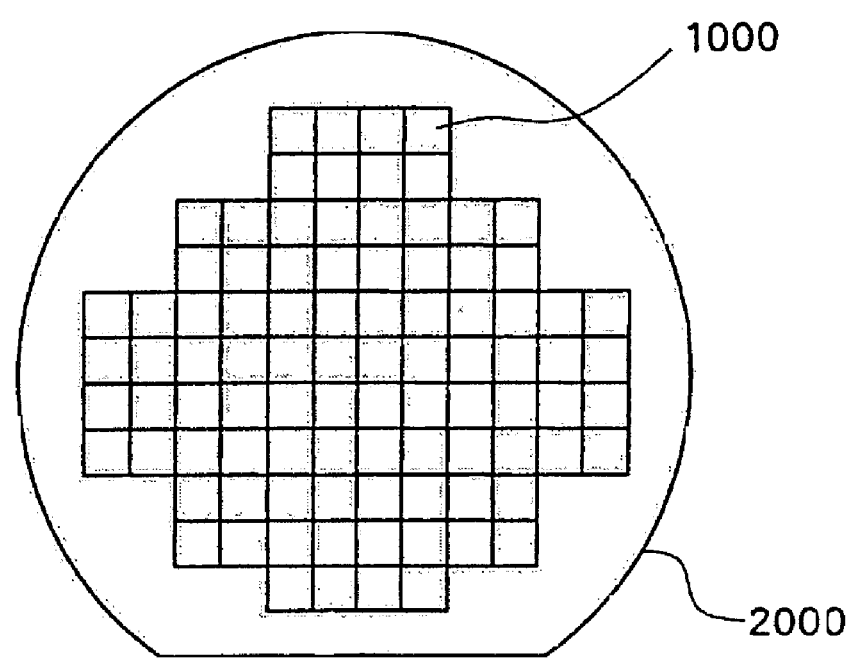
FIG. 12 is a plan view showing a semiconductor wafer on which a plurality of SRAM chips are formed.

FIG. 12 is a schematic plan view of the semiconductor wafer 2000 on which are provided many SRAM chips 1000 according to one embodiment of the present invention. The SRAM chip 1000 to be tested according to this embodiment is at the wafer level. In addition, hereafter, the test for the semiconductor device in the burn-in system and performed at ordinary temperatures will be exemplified for description.

In this test, first, the state is that the probes of the probe card with many probes are contacted to terminals disposed in the chips for testing, such as the data input/output terminals 602 and the control signal terminals 603. Therefore, the input and output of the data signal, the control signal and the power source are conducted between the tester (semiconductor device test system) connected through the probe card and the separate SRAM chips 1000, allowing the SRAM chips 1000 to be operated.

Then, to the TM terminal, one of the control signal terminals 603 of the SRAM chip 1000, the active (high level) test mode signal TM generated by the tester is inputted. Data input to the SRAM chip 1000 and the separate steps in the following test are performed after this test mode signal turns the SRAM chip 1000 to be in the test mode.

In inputting data to the SRAM chip 1000, the signal inputted to any one of input/output terminals among a plurality of input/output terminals is regarded as the signal inputted to each of the plurality of the input/output terminals. More specifically, in the example of the data input circuit 200 shown in FIG. 10, data is inputted according to the switching state of the switching circuit including the clocked inverters 208 and 210 corresponding to the test mode signal TM inputted to each of the clocked inverters 208 and 210.

Data thus inputted is written by the write driver 250 in the memory cells MC at the addresses specified by the row decoder 550 and the column decoder 570, based on the signals outputted by the address input circuit 100.

Furthermore, the addressing is performed according to the following steps. First, the address input circuit 100 uses the clock signal to create the address signal having one bit of the clock signal and one bit of each of the divided signals obtained by dividing the clock signal for plural times.

Then, the generated address signal is delayed for a predetermined time period which is equal to or longer than the time necessary for the generation of the address signal in the address signal generating step after the rise or fall of the clock signal, and it is outputted to the subsequent circuit such as the row decoder. Since the output time of the address signal to the subsequent circuit is delayed for the time which is equal to or longer than the time necessary for the generation of the address signal after the rise or fall of the clock signal, the addresses surely updated at every clock signal can be outputted to the subsequent circuit.

The data thus written in the memory cells is read out of the memory cell MC by the sense amplifier 350, the memory cell MC is specified through the address input circuit 100, the row decoder 550, and the column decoder 570. The data read out by the sense amplifier 350 is outputted to the input/output terminals 602 through the read latches RL and the output buffers OB in the data output circuit 300.

Electronic Instrument

Figure 13A:
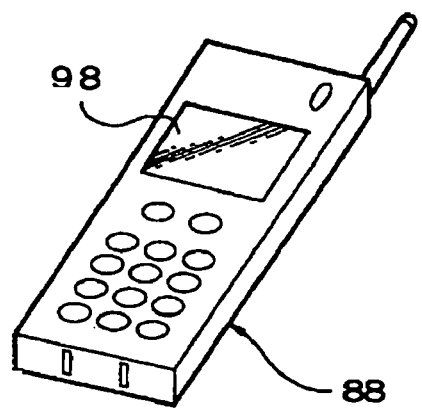
FIGS. 13A, 13B and 13C are perspective views showing examples of electronic instruments in which the SRAM chips according to one embodiment of the present invention are used.
Figure 13B:
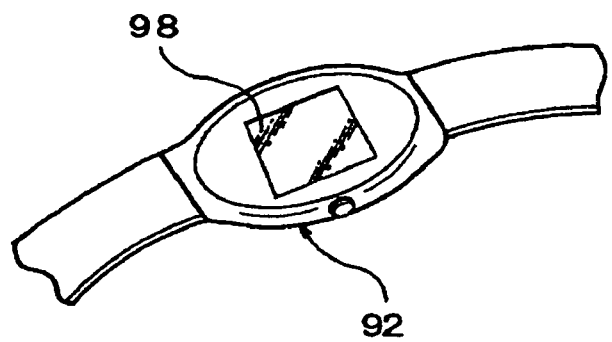
Figure 13C:
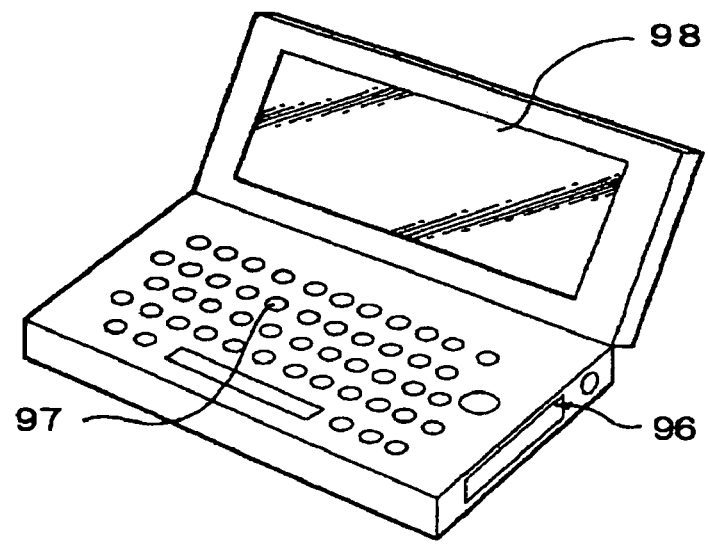
Figure 14:
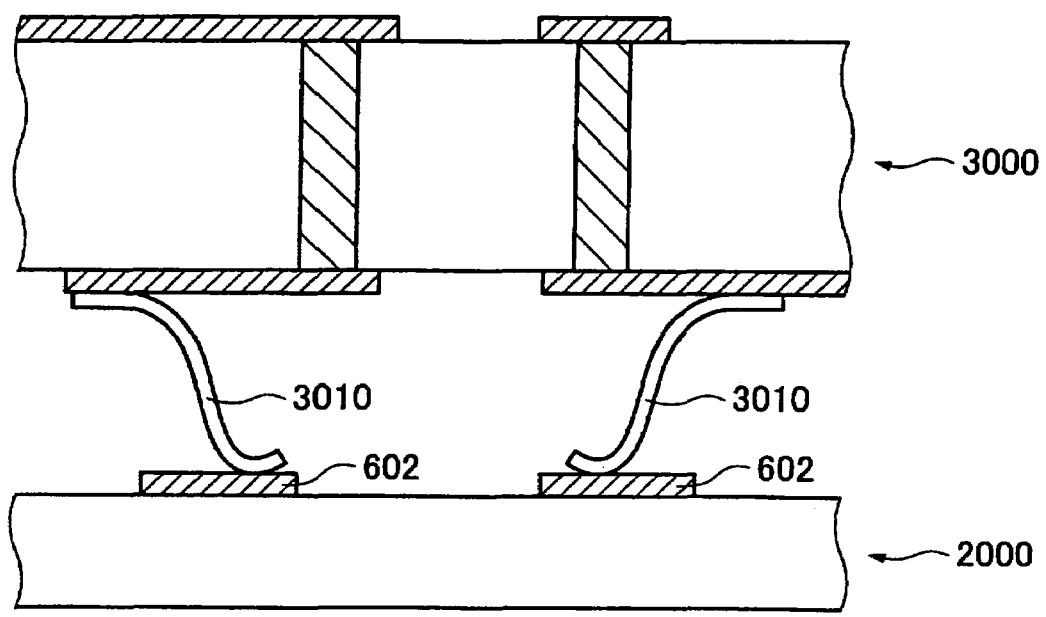
FIG. 14 is a diagram showing the testing of a semiconductor device at the wafer level.

FIGS. 13A, 13B and 13C are perspective views showing examples of electronic instruments in which the SRAM chips according to above-described embodiments are used. FIG. 13A shows a cellular phone 88, FIG. 13B shows a wrist watch 92, and FIG. 13C shows a portable information device 96.

These electronic instruments have the SRAM chip of these embodiments, a CPU (central processing unit), and a display driver for driving a display section 98. Components forming these instruments are connected to each other by bus lines or other signal transmitting means.

In addition to the cellular phone, the wrist watch, and the portable information device, electronic instruments using the SRAM chip according to any of these embodiments include various other electronic instruments such as a notebook personal computer, an electronic organizer, a pager, an electronic calculator, a terminal for point of sales (POS) system, an IC card, and a mini-disc player.

Modifications

In the above embodiments, the delay circuit delays the time of decoding in the row decoder, but the delay circuit could delay the time of decoding in the column decoder.

In the embodiments described above, the T flip-flops are used a divider circuits by an address signal generation section of the address input circuit 100, but other circuits may be used as divider circuits.

In the embodiments described above, a timer is used as a delay circuit for delaying an input time of the address signal from the address generation section to subsequent circuits, but other circuits may be used as a delay circuit.

The present invention is not limited to the above-described embodiments, and various modifications can be made within the scope of the invention.

What is claimed is:

1. A semiconductor device comprising:
    a plurality of memory cells for storing data;
    a clock signal input terminal to which a clock signal is inputted;
    a test mode signal input terminal to which a test mode signal for instructing operation in a test mode is inputted;
    an address generation section which generates an address signal for selecting part of the memory cells; and
    a delay circuit which delays an input time of the address signal from the address generation section to a subsequent circuit for a predetermined time period, based on the clock signal,
    wherein the address generation section has an address signal generation section which generates each bit of the address signal having a plurality of bits, using the clock signal in the test mode; and
    a plurality of address holding circuits which temporarily holds respective bit of the address signal
    wherein at least one bit among the bits of the address signal changes in every half clock cycle of the clock signal.

2. The semiconductor device as defined in claim 1,
    wherein the predetermined time period is equal to or longer than the time necessary for the generation of the address signal by the address signal generation section.

3. The semiconductor device as defined in claim 1, wherein:
    the address signal generation section has a plurality of serially connected divider circuits for dividing and outputting an inputted signal;
    the clock signal is inputted to a first divider circuit among the divider circuits;
    each of the divider circuits other than the first divider circuit receives an output from a preceding one of the divider circuits;
    the clock signal is inputted to one of the address holding circuits; and
    each of the address holding circuits other than the address holding circuit which receives the clock signal receives an output from corresponding one of the divider circuits.

4. The semiconductor device as defined in claim 3,
    wherein each of the divider circuits is a binary counter.

5. The semiconductor device as defined in claim 1, further comprising:
    a decoder circuit for decoding the address signal outputted from the plurality of the address holding circuits,
    wherein the delay circuit delays an input time of the address signal to the decoder circuit for a predetermined time period, based on the clock signal.

6. The semiconductor device as defined in claim 1, further comprising:
    a decoder circuit for decoding the address signal outputted from the plurality of the address holding circuits,
    wherein the delay circuit delays the time of decoding the address signal by the decoder circuit for a predetermined time period, based on the clock signal.

7. The semiconductor device as defined in claim 1,
    wherein the address generation section further includes a switching section for determining which of the address signal generated by the address signal generation section and an externally inputted address signal is held by the address holding circuits.

8. An electronic instrument comprising the semiconductor device as defined in claim 1.

9. A method of testing a semiconductor device comprising the steps of:
    generating an address signal having a plurality of bits by using a clock signal; and
    outputting the address signal to a subsequent circuit at a time delayed for a predetermined time period, based on the clock signal
    selecting a plurality of memory cells based on the address signal;
    writing data to and reading data from the plurality of memory cells;
    and testing a semiconductor device based on the read data
    wherein at least one bit among the bits of the address signal changes in every half clock cycle of the clock signal.

10. The method of testing the semiconductor device as defined in claim 9,
    wherein the predetermined time period of the delay in the step of outputting the address signal is equal to or longer than the time necessary for the generation of the address signal in the step of generating the address signal.

11. The method of testing a semiconductor device as defined in claim 9,
    wherein the address signal generated in the step of generating the address signal has two or more bits, the clock signal and a plurality of divided signals obtained by dividing the clock signal two or more times respectively becoming one bit of the bits forming the address signal.

* * * * *